United States Patent [19]
Bertin et al.

[11] Patent Number: 5,506,753
[45] Date of Patent: Apr. 9, 1996

[54] METHOD AND APPARATUS FOR A STRESS RELIEVED ELECTRONIC MODULE

[75] Inventors: Claude L. Bertin; Paul A. Farrar, both of So. Burlington; Gordon A. Kelley, Jr., Essex Junction; Christopher P. Miller, Underhill, all of Vt.

[73] Assignee: International Business Machines Corporation, Armonk, N.Y.

[21] Appl. No.: 311,815

[22] Filed: Sep. 26, 1994

[51] Int. Cl.⁶ .................................................. H05K 7/20
[52] U.S. Cl. .................... 361/705; 165/80.2; 165/185; 257/713; 257/777; 361/689
[58] Field of Search .................. 165/80.2, 185; 174/16.3; 257/706–707, 713, 714, 718–719, 726, 777; 361/689–690, 698–699, 704–710, 735, 744, 790

[56] References Cited

U.S. PATENT DOCUMENTS

| | | | |
|---|---|---|---|
| 4,211,354 | 7/1980 | Hoffman et al. | 228/118 |
| 4,451,973 | 6/1984 | Tateno et al. | 29/588 |
| 4,525,921 | 7/1985 | Carson et al. | 29/577 C |
| 4,706,166 | 11/1987 | Go | 361/403 |
| 4,918,511 | 4/1990 | Brown | 357/70 |
| 4,952,999 | 8/1990 | Robinson et al. | 357/68 |
| 4,983,533 | 1/1991 | Go | 361/388 |
| 5,098,609 | 3/1992 | Iruvanti et al. | 252/511 |
| 5,309,318 | 5/1994 | Beilstein, Jr. et al. | 361/689 |
| 5,422,435 | 6/1995 | Takiar et al. | 257/777 |

OTHER PUBLICATIONS

WO-093023982 PCT Int'l Appl., Nov. 1993, 361/735.
IBM Tech Disclosure Bulletin, "Stacked Surface Mount Package with Interposing Heat Sink", vol. 33, No. 1B, Jun. 1990, 361/710, p. 276.

*Primary Examiner*—Gregory D. Thompson
*Attorney, Agent, or Firm*—Heslin & Rothenberg

[57] ABSTRACT

A fabrication method and resultant electronic module that facilitates relief of thermally induced stress within the module. The fabrication method includes providing a plurality of integrated circuit chips having grooves in substantially planar main surfaces thereof. The chips are stacked and bonded to each other using an expandable material and a flowable adhesive to form an electronic module. The bonding is such that movement of individual IC chips within the module, in a direction perpendicular to their planar surfaces, is restricted. Upon thermal expansion of the module, the expandable material and the individual chips expand at different rates. However, the expandable material flows into the grooves, relieving thermally induced stress.

31 Claims, 6 Drawing Sheets

METHOD AND APPARATUS FOR A STRESS RELIEVED ELECTRONIC MODULE

TECHNICAL FIELD

The present invention relates in general to high density electronic packaging which facilitates optimization of the number of circuit elements to be included in a given volume. More particularly, this invention relates to relieving thermally induced stress in an electronic module comprising, for example, a stacked array of multiple integrated circuit chips bonded together with an adhesive.

BACKGROUND OF THE INVENTION

Since the development of integrated circuit technology, computers and computer storage devices have been made from integrated circuit (IC) chips formed from wafers of semiconductor material. After a wafer is made, the circuits are typically separated from each other by dicing the wafer into small chips. Thereafter, the individual chips are bonded to carriers of various types, interconnected by wires and packaged. Such "two-dimensional" packages of chips fail to optimize the number of circuits that may be fabricated in a given space, and also introduce undesirable signal delays, capacitance, and inductance as signals travel between chips. Recently, three-dimensional arrays of chips have emerged as an important packaging approach. A typical multichip electronic module consists of multiple IC chips adhesively secured together as a monolithic structure (a "stack").

One issue to be addressed is the issue of thermal expansivity of the materials of the stack. Different materials have different rates of thermal expansion associated therewith. For example, in an electronic module, when the IC chips and the adhesive layers are made from different materials, each will expand at a different rate when subjected to temperature increases. Unfortunately, electronic modules typically heat up during operation due to ohmic losses. Thus, when the temperature of a module increases, the chips and adhesive layers (bonding the chips together) expand at different rates inducing stress within the module.

Further module stress is induced when module expansion is constrained. For example, if a side surface of an electronic module is solder bump bonded to a mounting substrate, the bonds will constrain the expansion of the module in a direction perpendicular to the main surfaces of the chips comprising the module (hereinafter referred to as the "Z direction"). This constraint arises from, for example, each IC chip being bonded to the mounting substrate such that it is unable to move in the Z direction. Thus, the forces of the thermally expanding adhesive are constrained by the immobile substrate. Due to a generally high yield point, the "compressed" adhesive maintains its bonding and causes physical stress on the module which can lead to damage and failure of the solder bumps. The solder bumps fracture as a result of the expansion and contraction of the electronic module caused by changes in temperature. This is a well understood phenomenon in the industry. The present invention is directed towards solving these problems.

DISCLOSURE OF THE INVENTION

Briefly described, the present invention includes, in a first aspect, an electronic module comprising a semiconductor structure having a substantially planar surface, and a first integrated circuit (IC) chip having a first rate of thermal expansion and a substantially planar main surface including a cavity therein. The substantially planar main surface of the first IC chip is disposed in a parallel opposing relation to the substantially planar surface of the semiconductor structure. An expandable material is disposed between and mechanically coupled to the substantially planar surface of the semiconductor structure, and to the substantially planar main surface of the first IC chip. The expandable material has a second rate of thermal expansion different than the first rate. The cavity within the substantially planar main surface of the first IC chip provides a region into which the expandable material expands to relieve stress in the module. The stress being caused by differences in thermal expansion between the expandable material and the first IC chip.

As one enhancement, the semiconductor structure may comprise a second IC chip, and the substantially planar surface of the semiconductor structure comprises a substantially planar main surface of the second IC chip. Further, the substantially planar main surface of the first IC chip may comprise an inactive surface and the substantially planar main surface of the second IC chip may comprise an active surface. As a further enhancement, the electronic module may include a mechanical constraint for preventing expansion of the electronic module in a direction perpendicular to the substantially planar main surface of the first IC chip.

In another aspect, the present invention comprises an electronic module having a plurality of integrated circuit (IC) chips. Each IC chip has a substantially planar active main surface and a substantially planar inactive main surface. The inactive main surface of a first IC chip has a plurality of grooves therein. The plurality of IC chips are stacked to form an electronic module with the active main surface of each chip being oriented in a common direction. Further, the module includes an expandable material disposed between and mechanically coupling a substantially planar active main surface of a second IC chip to the substantially planar inactive main surface of the first IC chip. The plurality of grooves in the substantially planar inactive main surface of the first IC chip provide regions into which the expandable material expands to relieve stress. The stress being caused by differences in thermal expansion between the expandable material and the second integrated circuit chip (the expandable material has a first rate of thermal expansion and the second IC chip has a second, different rate of thermal expansion).

As an enhancement, the grooves of the electronic module may be sized so that a coolant may pass through them. Further, the electronic module may include a third IC chip. A substantially planar active main surface of the third IC chip is mechanically bonded to a substantially planar inactive main surface of the second IC chip by an expandable material disposed between the chips. The substantially planar inactive main surface of the second IC chip has a plurality of grooves therein.

Another aspect of the present invention includes an electronic module comprising a plurality of stacked integrated circuit ("IC") chips. Each IC chip has a first substantially planar main surface and a second substantially planar main surface. An advanced thermal compound is disposed between and mechanically bonded to a first substantially planar main surface of a first IC chip and to a second substantially planar main surface of a second IC chip. The advanced thermal compound is thermally conductive and electrically insulative. As an enhancement, the first substantially planar main surface of the first IC chip may have a cavity disposed therein, the advanced thermal compound filling the cavity.

In yet another aspect, the present invention includes a method for forming an electronic module. The method comprises providing a semiconductor structure having a substantially planar surface, and providing a first IC chip having a substantially planar main surface including a cavity therein. Further, the first IC chip has a first rate of thermal expansion. Next, the substantially planar surface of the semiconductor structure and the substantially planar main surface of the first IC chip are mechanically coupled with an expandable material. The expandable material has a second rate of thermal expansion, different than the first rate. The cavity within the substantially planar main surface of the first IC chip provides a region into which the expandable material expands to relieve stress. The stress being caused by differences in thermal expansion between the expandable material and the first IC chip.

Another aspect of the present invention includes a method for forming an electronic module. The method includes providing a plurality of stacked IC chips, each IC chip having a first substantially planar main surface and a second substantially planar main surface. A first substantially planar main surface of a first IC chip is mechanically bonded to a second substantially planar main surface of a second IC chip using an advanced thermal compound which is thermally conductive and electrically insulative. As an enhancement, the advanced thermal compound may be bonded to the first substantially planar main surface of the first IC chip using a flowable adhesive.

Advantageously, the techniques of the present invention facilitate the relief of thermally induced stress in an electronic module. Further, the techniques provide for the control of module expansion in the "Z direction." Cavities in the chips of the module (used to relieve thermally induced stress) may facilitate enhanced cooling of the module by facilitating the passage of a coolant therethrough.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

BEST MODE FOR CARRYING OUT THE INVENTION

Figure 1:
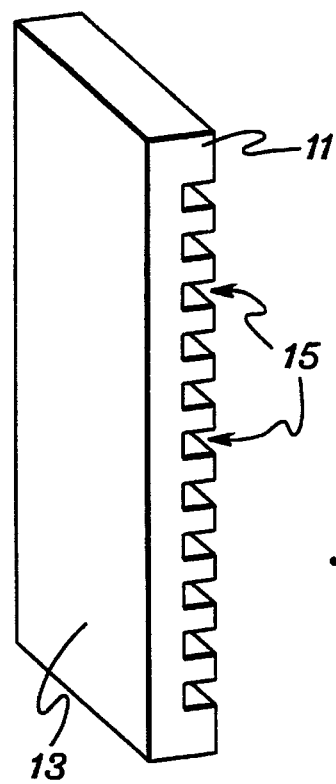
FIG. 1 is a perspective view of an integrated circuit (IC) chip of the present invention having grooves in a planar main (inactive) surface.

Certain preferred embodiments for relieving stress in an electronic module comprising a "stack" of integrated circuit (IC) chips are presented herein. FIG. 1 is a partial cross-sectional view of an IC chip (11), to be integrated into an electronic module comprising a plurality of stacked integrated circuit chips (i.e., a plurality of chips, "stacked" to form an electronic module). The chip may provide any function, for example, those associated with the functioning of the electronic module. Typical functions implemented may include, for example, memory, interface, processor (for example, a microprocessor) and/or control functions, although the chip may include any function known in the art for implementation on a semiconductor chip.

As shown in FIG. 1, IC chip 11 is formed with a novel "grooved" structure. A first substantially planar main surface of the chip has a plurality of grooves (15) formed therein. These grooves are formed on an inactive surface of the chip and extend into the substrate of the IC chip. Optionally, the grooves can be formed in an insulating layer, or other layer deposited on the inactive surface (or even in a similarly formed protective layer on an active surface) of the chip. Active substantially planar main surface 13 is unaffected by the grooves formed in the opposite inactive surface of the chip. As used herein and known in the art, an "active" surface of a chip is the surface that the IC componentry (for example, transistors) is formed on, while an "inactive" surface of an IC chip is a surface void of any active structures, such as transistors.

Figure 2:
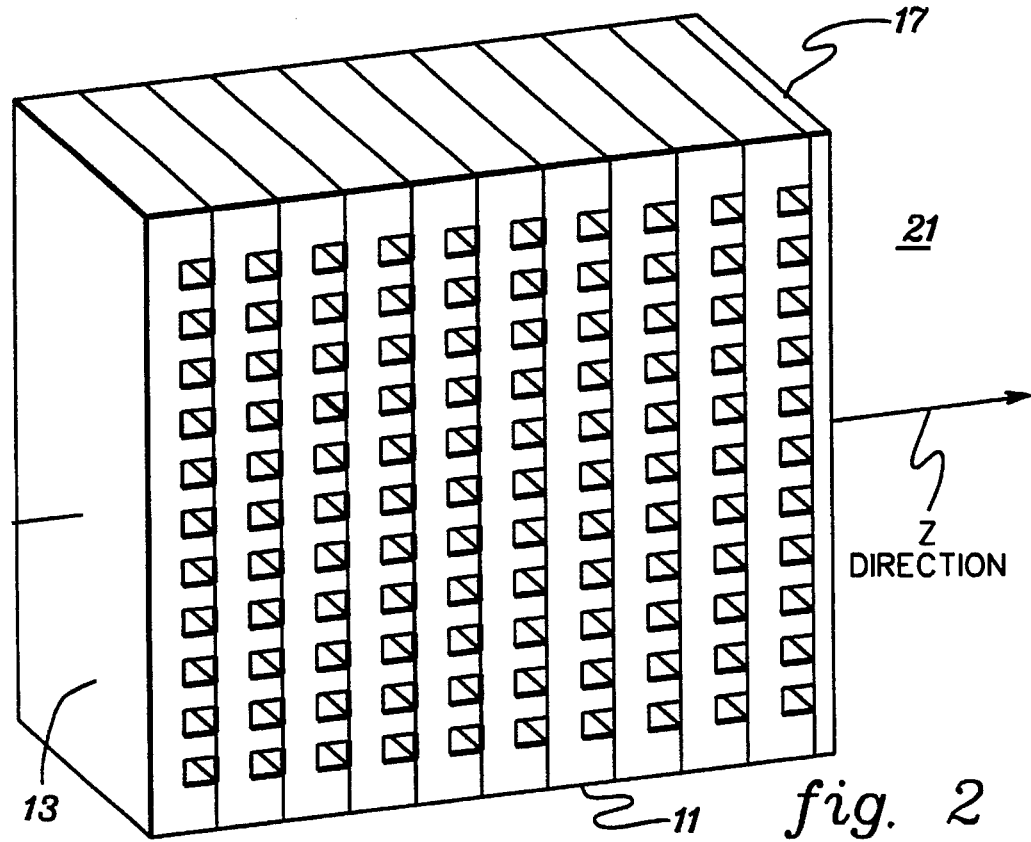
FIG. 2 is a perspective view of an electronic module of the present invention formed from a plurality of IC chips, an IC chip of the plurality being, for example, the IC chip of FIG. 1.

A plurality of IC chips (11) containing "grooved" back surfaces are stacked to form an electronic module (21) (FIG. 2). The stacking is performed such that the inactive main surface of each chip with grooves therein is bonded to the active main surface of an adjacent chip such that the inactive and active surfaces of adjacent chips are in parallel opposing relation to each other. The inactive main surface of the end integrated circuit chip is bonded to an end cap 17.

Figure 3:
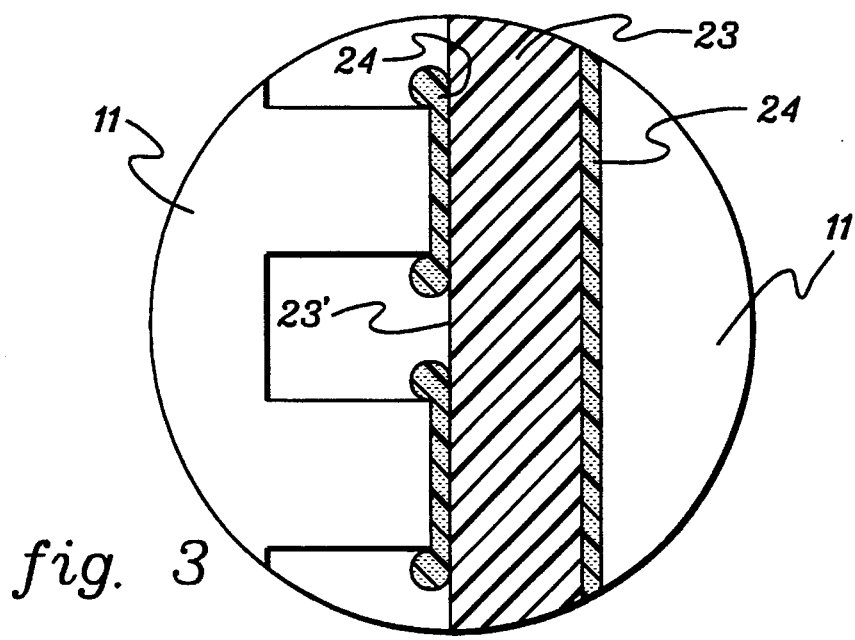
FIG. 3 is an expanded partial view of the interchip bonding of the electronic module of FIG. 2.

As shown in FIG. 3, a layer of expandable material (23) and adhesive layers (24) mechanically bond the chips to each other. The layers are disposed between the chips so that they do not fill the grooves (15) when the chips are initially bonded. Further, the thickness of the layer of expandable material (23) is controlled so that the grooves may accommodate expansion of the expandable material. The expandable material may comprise any one of many commercially available high temperature expandable materials having a low Young's Modulus such as High Temperature Silicone manufactured by Dow Corning Co. The adhesive material may comprise any one of many commercially available high temperature flowable adhesive materials, such as Thermid manufactured by National Starch Chemical Company, Bridgewater, N.J.

Figure 4:
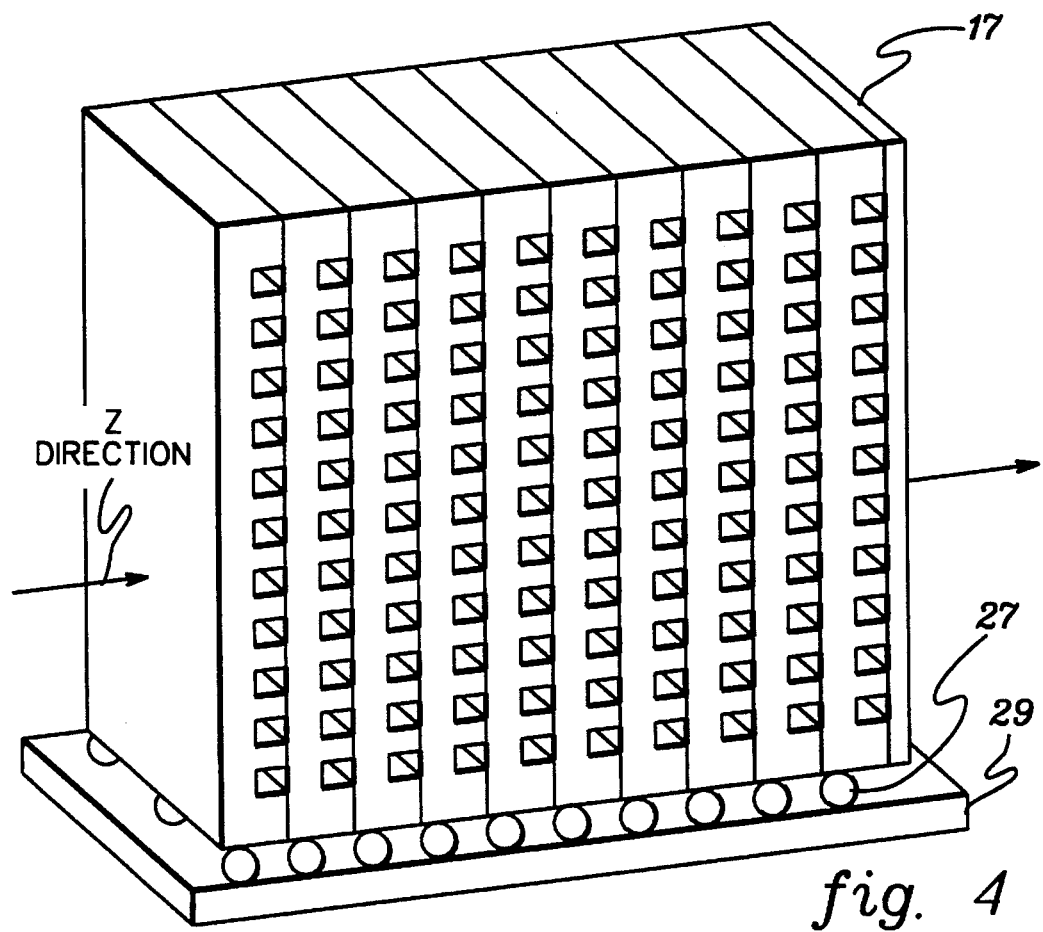
FIG. 4 is a perspective view of the electronic module of FIG. 3 after side surface bonding to a mounting substrate.

The next process step in one embodiment of the present invention is the bonding of the electronic module to a mounting substrate. As shown in FIG. 4, a side surface of the electronic module has been bonded using solder bumps 27 to a mounting substrate 29. The solder bumps adhere to contacts on both the electronic module and the mounting substrate (neither shown). Contacts on the electronic module may be formed corresponding to the transfer metals of each chip of the module by any conventional techniques known in the art, such as the formation of "T-Connects." Thus, each IC chip is individually bonded to the module. Contacts on the mounting substrate may also be formed by well known techniques, such as, for example, standard substrate metallization.

Figure 5:
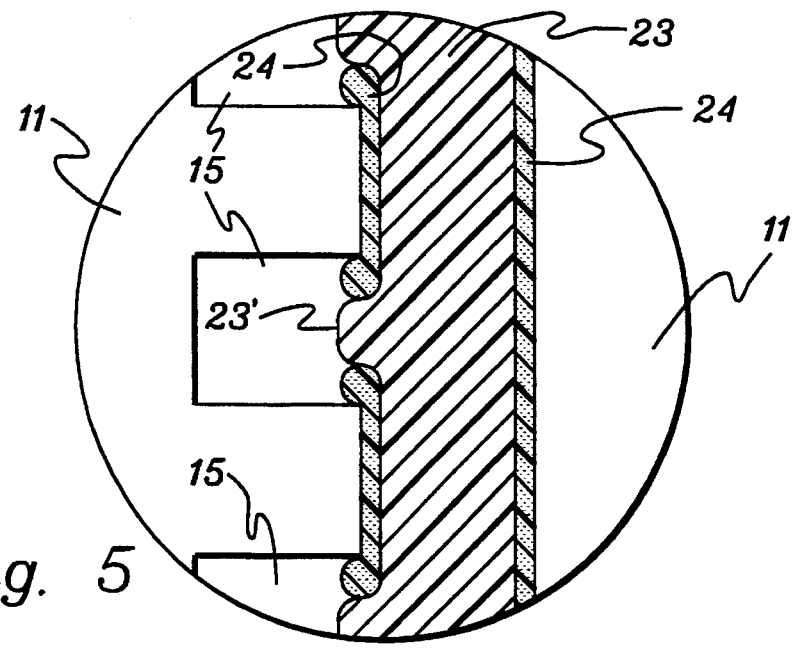
FIG. 5 is an expanded partial view of the interchip bonding of the electronic module of FIG. 4 subsequent to thermal expansion of the module and the expansion of the expandable material layer.

Bonding the IC chips to a mounting substrate rigidly secures the chips in place. Thus, motion of the chips in the "Z direction"(the direction perpendicular to the planar main surfaces of the chips) is restricted. By way of explanation, as the module operates and the temperature thereof increases, the chips and the expandable material will begin to expand. However, each will expand at a different rate based upon each material's respective rate of thermal expansivity. As the expandable material expands, it will apply a force pushing the chips apart from each other (in the "Z direction"). Similarly, as the chips expand in the "Z direction," the space between the chips where the expandable material is disposed is made smaller. This squeezes the expandable material, applying additional force in the "Z direction." However, the chips cannot move to accommodate the respective forces because they are bonded to the mounting substrate. Thus, grooves 15 provide a means for relieving this induced stress (FIG. 5).

Figure 6:
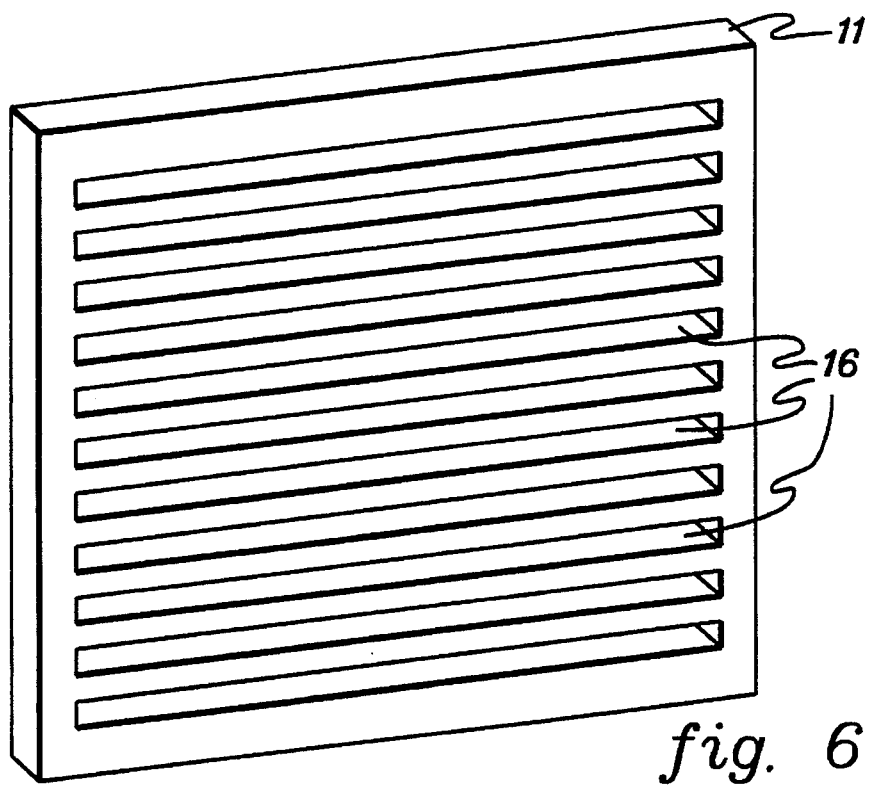
FIG. 6 is a perspective view of an alternate embodiment of an IC chip pursuant to the present invention having grooves in a planar main (inactive) surface which do not extend to the chip edges.

Upon the application of stress in the "Z direction," expandable material layer 23 will be compressed and will accordingly expand into the plurality of grooves (15) as shown by surface 23'. This flow relieves the compressive forces, reducing the overall stress on the module. While in one embodiment, grooves have been designed as extending longitudinally across the inactive surface of each chip, alternate designs are feasible. In fact, many different types of cavities, such as a plurality of concave cavities, and various geometric shapes will adequately serve to relieve stress in accordance with the techniques of the present invention (see, for example, FIG. 6, discussed below).

As an enhanced feature embodiment of the present invention, the grooves can be sized to facilitate cooling of the module. Previously, fluid or gas flow around an electronic module has been used to cool a module (See, e.g., "Thermally Enhanced Semiconductor Chip Package," issued May, 3, 1994 as U.S. Pat. No. 5,309,318, and herein incorporated by reference). In the present invention, the grooves can allow, a fluid or gas (a "coolant") to flow through the module, further enhancing cooling of the module. Typical dimensions of a groove to accommodate a coolant flow are 125–250 micrometers deep and 500–1000 micrometers wide, although the dimensions may vary based upon characteristics of the coolant used. With the use of such grooves, heat is removed from within each chip of the module eliminating the need for heat to travel to a chip edge for dissipation.

Figure 7:
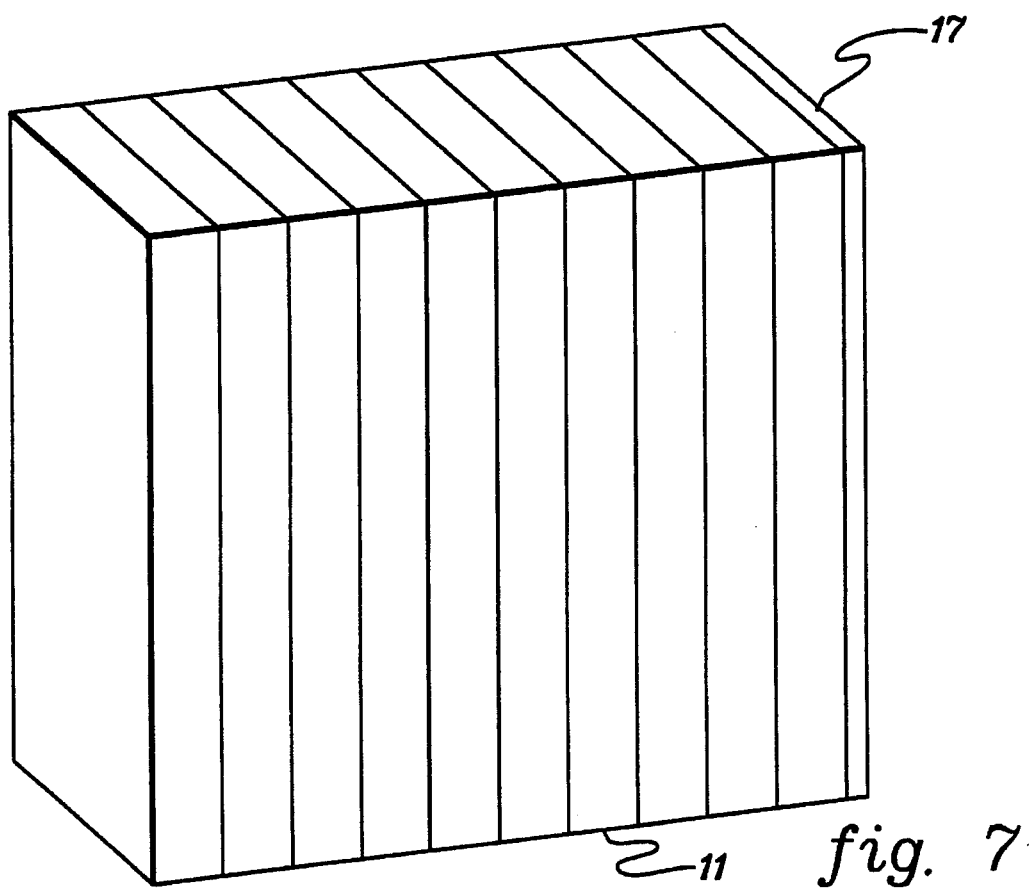
FIG. 7 is a perspective view of an electronic module of the present invention formed from a plurality of IC chips, an IC chip of the plurality being, for example, the IC chip of FIG. 6.

It should be noted that not all embodiments of the present invention permit a coolant to flow through the module. For example, grooves 16 of chip 11 of FIG. 6 do not extend to the edges of the chip. Thus, when an electronic module is formed from such chips (FIG. 7), openings in the side surface of the module do not exist to permit a coolant flow through the module.

The stress relief techniques described herein are not limited to applications in electronic modules comprising stacks of chips. The techniques can be applied to any situation where one semiconductor structure (for example, an electronic module, a chip or a substrate) is mounted to another semiconductor structure. For example, a single integrated circuit chip could be bonded to a mounting substrate. Stress induced by differences in the rate of thermal expansion between the substrate, IC chip and expandable material would be mitigated by the expansion of the expandable layer into grooves disposed within a surface of the chip (or substrate). Mechanical clamping of the chip to the substrate (which constrains expansion in the "Z direction" and enhances the flow of adhesive) may be provided by various packaging techniques.

Figure 8:
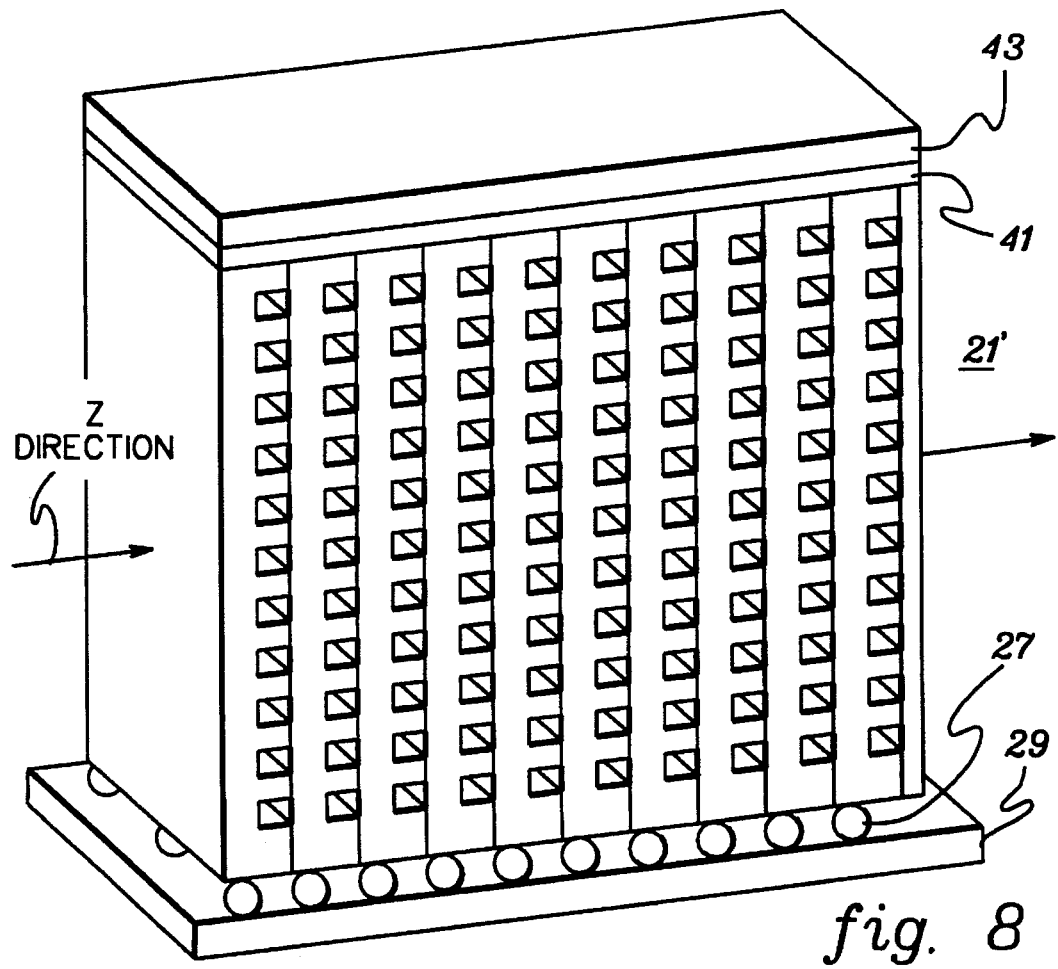
FIG. 8 is a perspective view of an electronic module of the present invention having a strap constraining movement of the chips in the "Z direction."

One such technique as applied to electronic modules comprising stacks of IC chips is shown in FIG. 8. Adhesive layer 41 attaches strap layer 43 to the surface of the electronic module (21). The strap layer is used to control the thermal expansion in the Z direction of the electronic module. The grooves (15) and expandable layer (23, FIG. 5), combine to reduce the stress in the electronic module resulting from the resistance to thermal expansion imposed by strap 43. Silicon and ceramics are examples of strap materials.

Figure 9:
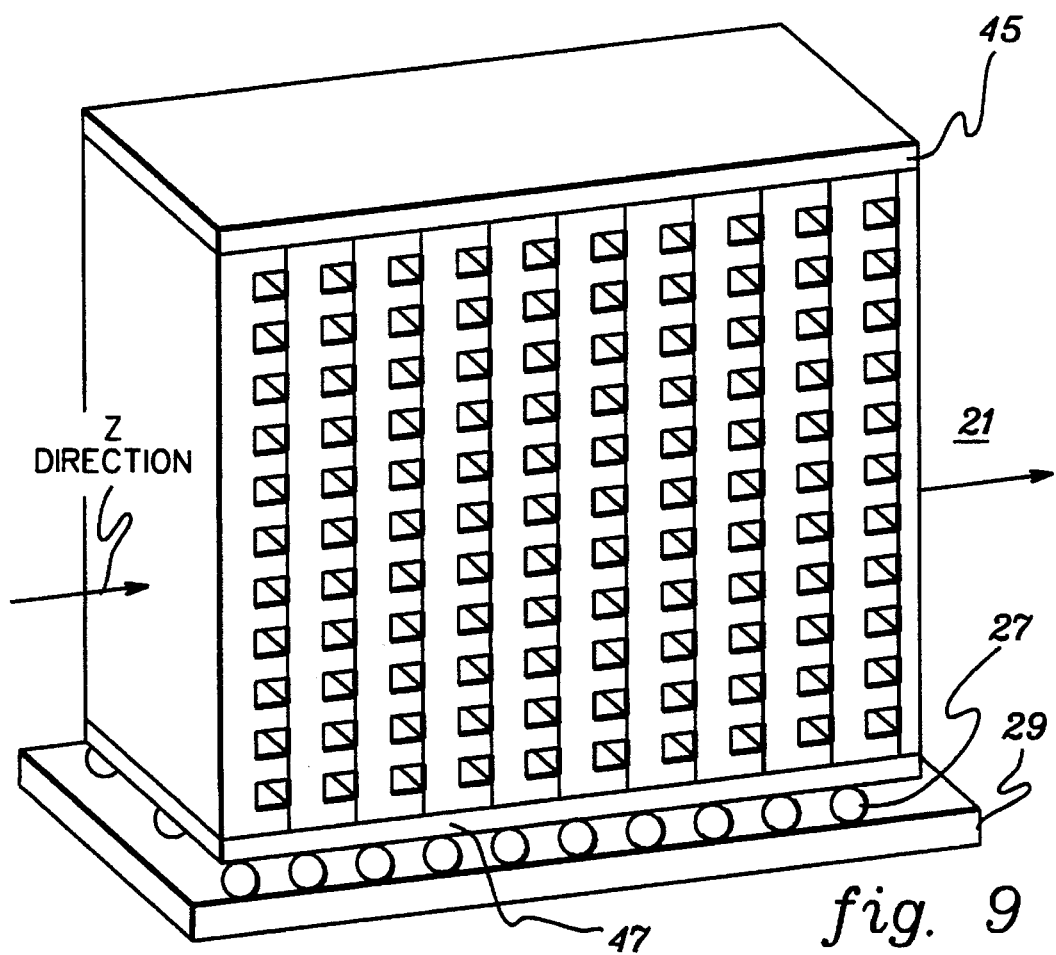
FIG. 9 is a perspective view of an electronic module of the present invention having two elastic restraining layers disposed on opposite side surfaces of the electronic module.

Another constraining technique is shown in FIG. 9. Expansivity restraining layers 45 and 47 are deposited on two opposing parallel side surfaces of the electronic module. One example of such layers is polyimide film with typical expansion coefficients in the range of 3°–10° ppm/C. This film adheres to the side surfaces of the electronic module and can be deposited by techniques well known in the art such as spinning, evaporation and roll-on. Layer 47, between electronic module 21 and solder bump 27 controls expansion in the proximity of the solder bumps so as to reduce stress resulting in fracture failures thereof. Restraining layer 47 contains via holes (not shown) formed by standard industry techniques for subetching through an insulating layer to permit electrical contact between solder bumps 27 and an electrical contact layer (not shown) on the electronic module.

Still another technique of constraining electronic module expansion to reduce stress of solder balls may be provided by encapsulation of a chip coupled to a substrate.

Figure 10:
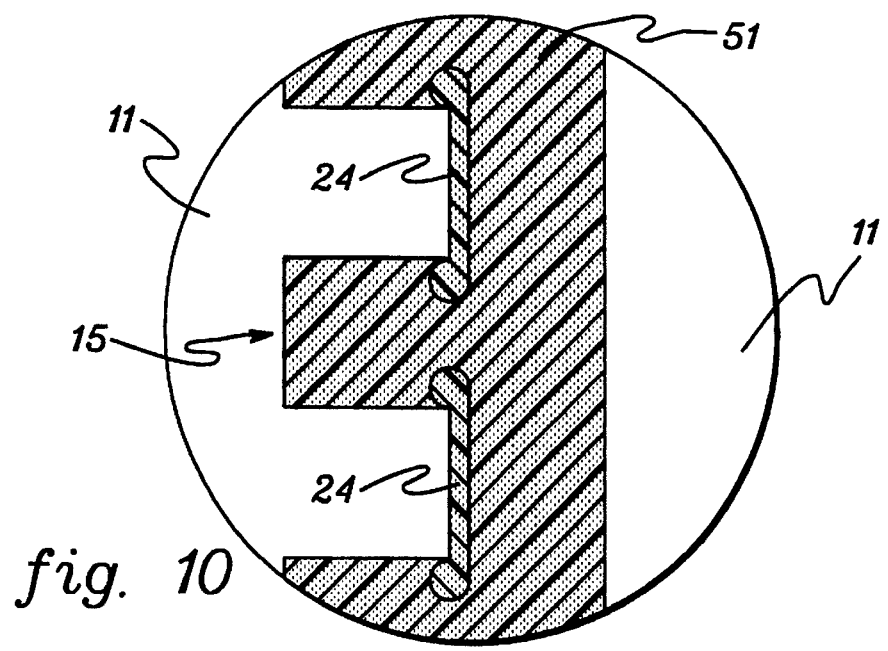
FIG. 10 is a cross-sectional view of the interchip bonding of the present invention using an advanced thermal compound and an adhesive layer.

In yet another embodiment of the present invention, the grooves (15) and regions between the chips can be filled with an advanced thermal compound ("ATC") 51, as shown in FIG. 10. The ATC is a thermally conductive and electrically insulating material which enhances thermal distribution throughout the electronic module and reduces overall temperature increases (see, for example, U.S. Pat. No. 5,098,609, "Stable High Solids High Thermal Conductivity Pastes", issued Mar. 24, 1992, and incorporated herein by reference). It also reduces localized thermal expansion effects caused by IC chips 11 dissipating different amounts of power in different regions. Grooves 15 of FIG. 10 enhance thermal flow between IC chips by increasing the amount of surface area between the ATC and the chips, however, the grooves may be omitted without changing the basic operating principles of this embodiment. It should be generally noted that all insulating layers on IC chips 11 may be formed using the ATC, maximizing heat distribution within the electronic module. Adhesive layer 24 may be located anywhere in the region between the two IC chips 11, for example, on one main surface of an IC chip as shown.

Figure 11:
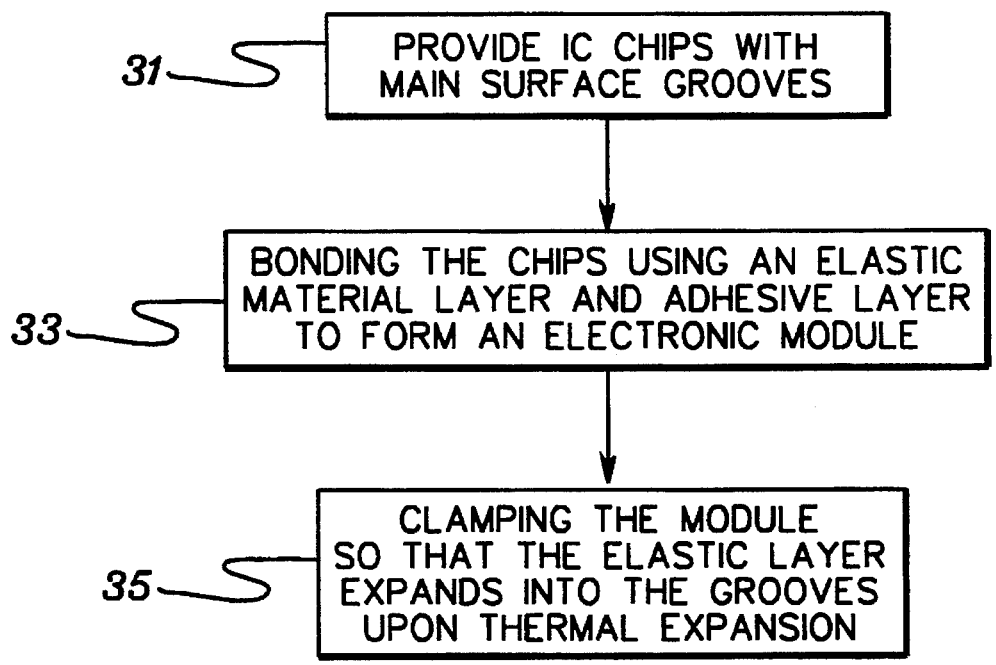
FIG. 11 is a flowchart showing a method of fabricating the electronic module of the present invention.

To briefly summarize, the flowchart of FIG. 11 shows a method for forming the electronic module of the present invention. IC chips are provided having back (inactive) surface grooves therein (31). Next, the chips are bonded together to form an electronic module (33). Specifically, the inactive main surface of each chip having grooves therein is bonded to an active main surface of an adjacent chip using a flowable adhesive and expandable material layer (the substantially planar main surfaces of adjacent chips being oriented in an opposing parallel manner). After the module has been constructed, it is solder bump bonded to a mounting substrate. This provides the mechanical clamping (35) which forces the expansion of the expandable layer into grooves during thermal expansion of the chips, adhesive, and expandable material layer comprising the module. Additional constraining layers may be added to the electronic module's surfaces as previously illustrated herein.

Figure 12:
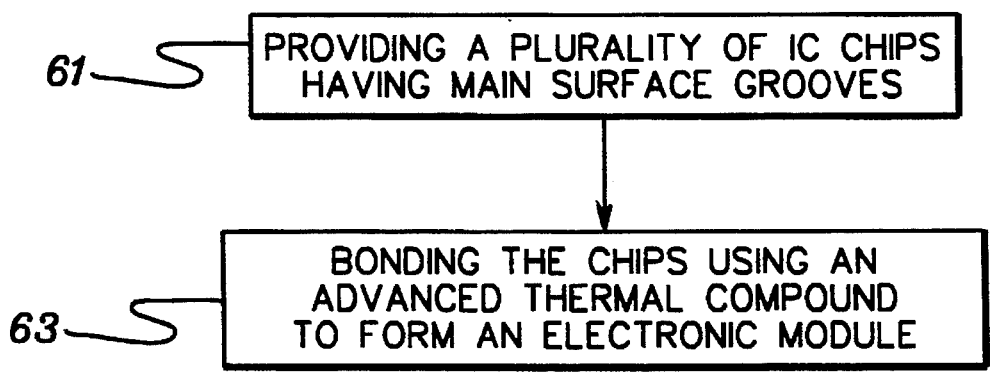
FIG. 12 is a flowchart showing a method of fabricating the electronic module of the present invention using an advanced thermal compound between chips.

In an alternate embodiment of the present invention using an advanced thermal compound, the flowchart of FIG. 12 shows a method for forming such an electronic module. A plurality of IC chips are provided having main surface grooves therein (61). As previously stated herein, these grooves may be omitted in this particular embodiment. The chips are bonded to each other using an advanced thermal compound, forming an electronic module (63). Specifically, as shown in FIG. 10, the inactive main surface of each chip having grooves therein is bonded to an active main surface of an adjacent chip using the ATC and a thin flowable adhesive layer on the grooved surface. Since thermal expansion has been inherently improved by the advanced heat distribution of the electronic module using the ATC, clamping to facilitate expansion of a material is unnecessary. However, this module may be solder bump bonded to a substrate for external electrical connectivity.

The techniques of the present invention described herein address the problem of thermally induced stress within an electronic module and on solder bump connections associated therewith. As examples, the present invention offers the following advantages.

1. The limiting of stress created within the electronic module while permitting good adhesion between IC layers.

2. Limiting module expansion in the "Z direction."

3. The reduction of stress on solder bump connections by using low Young's Modulus expandable layers on IC chips with expansion grooves.

4. The reduction of stress on solder bumps by reducing the temperature expansion range of the electronic module. One approach is to cool the module by forcing a coolant through grooves in the electronic module. Another approach is to use an advance thermal compound to enhance the distribution of heat uniformly throughout the electronic module.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. An electronic module comprising:

a semiconductor structure having a substantially planar surface;

a first integrated circuit ("IC") chip having a substantially planar main surface including a cavity therein, said substantially planar main surface of said first IC chip being disposed in parallel opposing relation to said substantially planar surface of said semiconductor structure, said first IC chip having a first rate of thermal expansion;

an expandable material disposed between and mechanically coupled to said substantially planar surface of said semiconductor structure and to said substantially planar main surface of said first IC chip, said expandable material having a second rate of thermal expansion; and wherein the first rate of thermal expansion of said first IC chip is different than the second rate of thermal expansion of said expandable material, and wherein said cavity provides a region into which said expandable material expands to relieve stress caused by said difference in thermal expansion between said expandable material and said first IC chip.

2. The electronic module of claim 1, wherein said semiconductor structure comprises a second IC chip, and wherein said substantially planar surface comprises a substantially planar main surface of the second IC chip.

3. The electronic module of claim 2, wherein the substantially planar main surface of the first IC chip comprises an inactive surface and the substantially planar main surface of the second IC chip comprises an active surface.

4. The electronic module of claim 1, further comprising a mechanical constraint means mechanically coupled to said IC chip and to said semiconductor structure for preventing expansion of the electronic module in a direction perpendicular to the substantially planar main surface of the first IC chip.

5. The electronic module of claim 1, wherein the cavity extends into the first integrated circuit chip a depth having a first length, and wherein the expandable material has a thickness of a second length, said second length being less than said first length.

6. The electronic module of claim 1, wherein said cavity within said first IC chip comprises at least one groove within said first IC chip.

7. The electronic module of claim 1, wherein said cavity within said first IC chip is sized such that a coolant may pass through the cavity within said first IC chip.

8. The electronic module of claim 1, wherein said semiconductor structure comprises a mounting substrate.

9. The electronic module of claim 1, further comprising a flowable adhesive disposed between and mechanically bonded to said expandable material and to said substantially planar surface of said semiconductor structure for facilitating said expandable material being mechanically coupled to said substantially planar surface of said semiconductor structure.

10. The electronic module of claim 1, further comprising a flowable adhesive disposed between and mechanically bonded to said expandable material and to said substantially planar main surface of said first integrated circuit chip for facilitating said expandable material being mechanically coupled to said substantially planar main surface of said first integrated circuit chip.

11. An electronic module comprising:

a plurality of integrated circuit ("IC") chips, each IC chip of said plurality of IC chips having a substantially planar active main surface and a substantially planar inactive main surface, a substantially planar inactive main surface of a first IC chip of said plurality of IC chips having a plurality of grooves therein, said plurality of IC chips being stacked to form an electronic module wherein said substantially planar active main surfaces are oriented in a common direction;

an expandable material disposed between and mechanically coupling a substantially planar active main surface of a second IC chip of said plurality of IC chips to said substantially planar inactive main surface of the first IC chip of said plurality of IC chips, said second IC chip having a first rate of thermal expansion and said expandable material having a second rate of thermal expansion, said second rate of thermal expansion being different than the first rate of thermal expansion; and wherein said plurality of grooves in said substantially planar inactive main surface of said first IC chip provides a plurality of regions into which said expandable material can expand to relieve stress caused by said difference in thermal expansion between said expandable material and said second integrated circuit chip.

12. The electronic module of claim 11, further comprising a mechanical constraint means mechanically coupled to said first IC chip and to said, second IC chip for preventing expansion of the electronic module in a direction perpendicular to the substantially planar main surface of each IC chip of said plurality of IC chips.

13. The electronic module of claim 11, wherein said subplurality of grooves in said first IC chip are sized such that a coolant may pass therethrough.

14. The electronic module of claim 11, further comprising an expandable material disposed between and mechanically bonding a substantially planar inactive main surface of the second IC chip of said plurality of IC chips to a substantially planar active main surface of a third IC chip of said plurality of IC chips, said substantially planar inactive main surface of the second IC chip having a plurality of grooves therein.

15. The electronic module of claim 11, further comprising a flowable adhesive disposed between and mechanically bonding said expandable material to said substantially planar active main surface of said second IC chip for providing said mechanical coupling therebetween.

16. The electronic module of claim 11, further comprising a flowable adhesive disposed between and mechanically bonding said expandable material to said substantially planar inactive main surface of said first IC chip for providing said mechanical coupling therebetween.

17. An electronic module comprising:
a plurality of stacked integrated circuit ("IC") chips, each individual IC chip of said plurality of IC chips being a bare IC chip and having a first substantially planar main surface and a second substantially planar main surface;
an advanced thermal compound disposed between and mechanically bonded to a first substantially planar main surface of a first IC chip of said plurality of IC chips and to a second substantially planar main surface of a second IC chip of said plurality of IC chips, said advanced thermal compound being thermally conductive and electrically insulative; and
wherein said first substantially planar main surface of said first IC chip has at least one cavity disposed therein, said advanced thermal compound at least partially filling said cavity.

18. The electronic module of claim 17, further comprising additional advanced thermal compound disposed between and mechanically bonded to a first substantially planar main surface of at least some IC chips of said plurality of IC chips other than said first IC chip, and to a second substantially planar main surface of an adjacent IC chip of said plurality of IC chips.

19. The electronic module of claim 17, wherein said at least one cavity comprises a plurality of grooves.

20. A method for forming an electronic module comprising:
(a) providing a semiconductor structure having a substantially planar surface;
(b) providing a first integrated circuit ("IC") chip having a substantially planar main surface including a cavity therein, said first IC chip having a first rate of thermal expansion; and
(c) mechanically coupling said substantially planar surface of said semiconductor structure to said substantially planar main surface of said first IC chip with an expandable material, said expandable material having a second rate of thermal expansion different than said first rate of thermal expansion, wherein said cavity provides a region into which said expandable material expands to relieve stress caused by differences in thermal expansion between said expandable material and said first IC chip.

21. The method of claim 20, wherein said providing step (a) comprises providing as said semiconductor structure a second IC chip having a substantially planar main surface, said substantially planar main surface comprising said substantially planar surface of said semiconductor structure.

22. The method of claim 21, wherein said providing step (a) comprises providing the second IC chip with an active surface as said substantially planar main surface, and wherein said providing step (b) comprises providing the first IC chip with an inactive surface as said substantially planar main surface.

23. The method of claim 20, further comprising providing a constraint mechanically coupled to said semiconductor structure and to said first IC chip for constraining expansion of the electronic module in a direction perpendicular to the substantially planar main surface of the first IC chip.

24. The method of claim 20, wherein said providing step (b) comprises providing said first IC chip wherein said cavity comprises at least one groove.

25. The method of claim 20, wherein said providing step (b) comprises providing said first IC chip with said cavity sized to facilitate a flow of coolant through said cavity.

26. The method of claim 20, wherein said providing step (a) comprises providing a mounting substrate as said semiconductor structure.

27. The method of claim 20, wherein said mechanical coupling step (c) mechanically coupling said expandable material to said substantially planar surface of said semiconductor structure using a flowable adhesive.

28. The method of claim 20, wherein said mechanical coupling step (c) comprises mechanically coupling said expandable material to said substantially planar main surface of said first IC chip using a flowable adhesive.

29. A method for forming an electronic module comprising the steps of:
(a) providing a plurality of stacked integrated circuit ("IC") chips, each individual IC chip of said plurality of stacked IC chips being a bare IC chip and having a first substantially planar main surface and a second substantially planar main surface; and
(b) mechanically coupling a first substantially planar main surface of a first IC chip of said plurality of IC chips to a second substantially planar main surface of a second IC chip of said plurality of IC chips using an advanced thermal compound, said advanced thermal compound being thermally conductive and electrically insulative,
wherein said substantially planar main surface of said first IC chip has at least one cavity disposed therein and said mechanically coupling comprises at least partially filling said at least one cavity with said advanced thermal compound.

30. The method of claim 29, wherein said coupling step (b) comprises bonding said advanced thermal compound to said first substantially planar main surface of said first IC chip using a flowable adhesive.

31. The method of claim 29, wherein said at least one cavity comprises a plurality of grooves, and wherein said coupling step (b) comprises filling said plurality of grooves with advanced thermal compound.

\* \* \* \* \*

UNITED STATES PATENT AND TRADEMARK OFFICE
CERTIFICATE OF CORRECTION

PATENT NO. : 5,506,753
DATED : Apr. 9, 1996
INVENTOR(S) : Bertin et al.

It is certified that error appears in the above-indentified patent and that said Letters Patent is hereby corrected as shown below:

Column 6, line 35, delete "ppm/C" and substitute therefor --ppm/°c--.

Column 8, line 26, between "said" and "IC" insert --first--.
Column 9, line 19, delete ",".
Column 10, line 46, between "(c)" and "mechanically" insert --comprises--.
Column 12, line 5, between "with" and "advanced" insert --said--.

Signed and Sealed this

Sixteenth Day of July, 1996

Attest:

BRUCE LEHMAN

*Attesting Officer*   *Commissioner of Patents and Trademarks*